(12) United States Patent
Kim et al.

(10) Patent No.: US 10,096,560 B2
(45) Date of Patent: Oct. 9, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Byoung Chan Kim, Suwon-si (KR); Yong Ho Baek, Suwon-si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/837,611

(22) Filed: Dec. 11, 2017

(65) Prior Publication Data
US 2018/0102332 A1    Apr. 12, 2018

Related U.S. Application Data

(63) Continuation of application No. 15/468,606, filed on Mar. 24, 2017.

(30) Foreign Application Priority Data

Sep. 12, 2016    (KR) .................. 10-2016-0117245

(51) Int. Cl.
H01L 23/48    (2006.01)
H01L 23/52    (2006.01)
(Continued)

(52) U.S. Cl.
CPC ............ *H01L 24/02* (2013.01); *H01L 23/293* (2013.01); *H01L 23/3178* (2013.01);
(Continued)

(58) Field of Classification Search
None
See application file for complete search history.

(56) References Cited

U.S. PATENT DOCUMENTS 8,803,306 B1    8/2014  Yu et al.
9,373,605 B1    6/2016  Wang et al.
(Continued)

FOREIGN PATENT DOCUMENTS

CN          103168358 A     6/2013
KR    10-2013-0132163 A    12/2013
(Continued)

OTHER PUBLICATIONS

Non-Final Office Action issued in corresponding parent U.S. Appl. No. 15/468,606, dated Oct. 11, 2017.
(Continued)

*Primary Examiner* — Calvin Choi
(74) *Attorney, Agent, or Firm* — McDermott Will & Emery LLP

(57)    ABSTRACT

A fan-out semiconductor package includes: a first interconnection member having a through-hole; a processor chip disposed in the through-hole; a memory chip disposed in the through-hole and including a plurality of dies stacked on each other; an encapsulant encapsulating at least portions of the first interconnection member, the memory chip, and the processor chip; and a second interconnection member disposed on the first interconnection member, an active surface of the memory chip, and an active surface of the processor chip. The first interconnection member and the second interconnection member respectively include redistribution layers electrically connected to connection pads of the processor chip and connection pads of the memory chip, and the connection pads of the processor chip and the connection pads of the memory chip are electrically connected to each other by the redistribution layer of the second interconnection member.

20 Claims, 15 Drawing Sheets

(51) Int. Cl.
- *H01L 29/40* (2006.01)
- *H01L 23/00* (2006.01)
- *H01L 23/29* (2006.01)
- *H01L 23/31* (2006.01)
- *H01L 25/065* (2006.01)

(52) U.S. Cl.
CPC .......... *H01L 24/17* (2013.01); *H01L 25/0657* (2013.01); *H01L 2224/02373* (2013.01); *H01L 2224/02379* (2013.01); *H01L 2224/1712* (2013.01); *H01L 2225/06513* (2013.01); *H01L 2225/06548* (2013.01); *H01L 2225/06582* (2013.01)

(56) References Cited

U.S. PATENT DOCUMENTS

| | | | |
|---|---|---|---|
| 2012/0056329 A1* | 3/2012 | Pagaila | H01L 21/56 257/774 |
| 2015/0046612 A1* | 2/2015 | Gupta | G06F 13/4018 710/105 |
| 2015/0235991 A1* | 8/2015 | Gu | H01L 25/0655 257/762 |
| 2015/0348954 A1 | 12/2015 | Chandolu | |
| 2016/0043047 A1 | 2/2016 | Shim et al. | |
| 2016/0093598 A1 | 3/2016 | Jo et al. | |

FOREIGN PATENT DOCUMENTS

| | | |
|---|---|---|
| KR | 10-2016-0037582 A | 4/2016 |
| TW | 201606972 A | 2/2016 |
| TW | 201618196 A | 5/2016 |
| WO | 2012/012338 A1 | 1/2012 |

OTHER PUBLICATIONS

Notice of Allowance issued in corresponding parent U.S. Appl. No. 15/468,606, dated Jan. 25, 2018.

Taiwanese Office Action issued in corresponding Taiwanese Patent Application No. 106109524, dated Apr. 27, 2018, with English Translation.

Korean Office Action issued in corresponding Korean Patent Application No. 10-2016-0117245, dated Jul. 16, 2018, with English Translation.

* cited by examiner

US 10,096,560 B2

FAN-OUT SEMICONDUCTOR PACKAGE

CROSS-REFERENCE TO RELATED APPLICATION(S)

This application is a continuation of U.S. patent application Ser. No. 15/468,606, filed on Mar. 24, 2017, which claims benefit of priority to Korean Patent Application No. 10-2016-0117245 filed on Sep. 12, 2016 in the Korean Intellectual Property Office, the disclosure of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of performing various functions, being thinned, and having excellent mounting reliability.

According to an aspect of the present disclosure, a fan-out semiconductor package may be provided, in which a processor chip and a memory chip are disposed substantially on the same level in the same through-hole or different through-holes in a interconnection member and are electrically connected to each other by a redistribution layer.

According to an aspect of the present disclosure, a fan-out semiconductor package may include: a first interconnection member having a through-hole; a processor chip disposed in the through-hole of the first interconnection member and having an active surface having connection pads disposed thereon and an inactive surface opposing the active surface; a memory chip disposed in the through-hole of the first interconnection member, having an active surface having connection pads disposed thereon, and including a plurality of dies stacked on each other; an encapsulant encapsulating at least portions of the first interconnection member, the memory chip, and the processor chip; and a second interconnection member disposed on the first interconnection member, the active surface of the memory chip, and the active surface of the processor chip. The first interconnection member and the second interconnection member respectively include redistribution layers electrically connected to the connection pads of the processor chip and the connection pads of the memory chip, and the connection pads of the processor chip and the connection pads of the memory chip are electrically connected to each other by the redistribution layer of the second interconnection member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
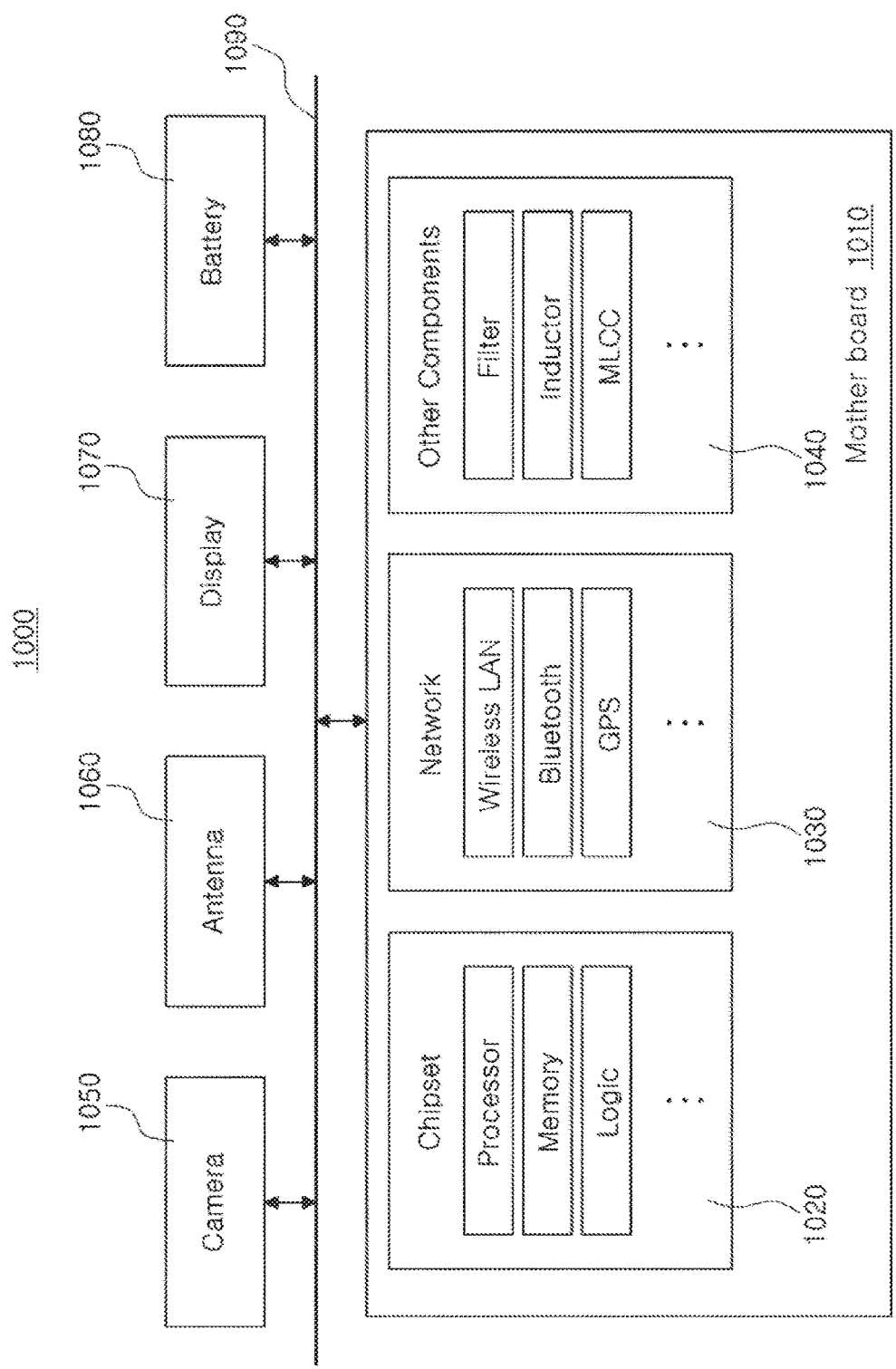
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
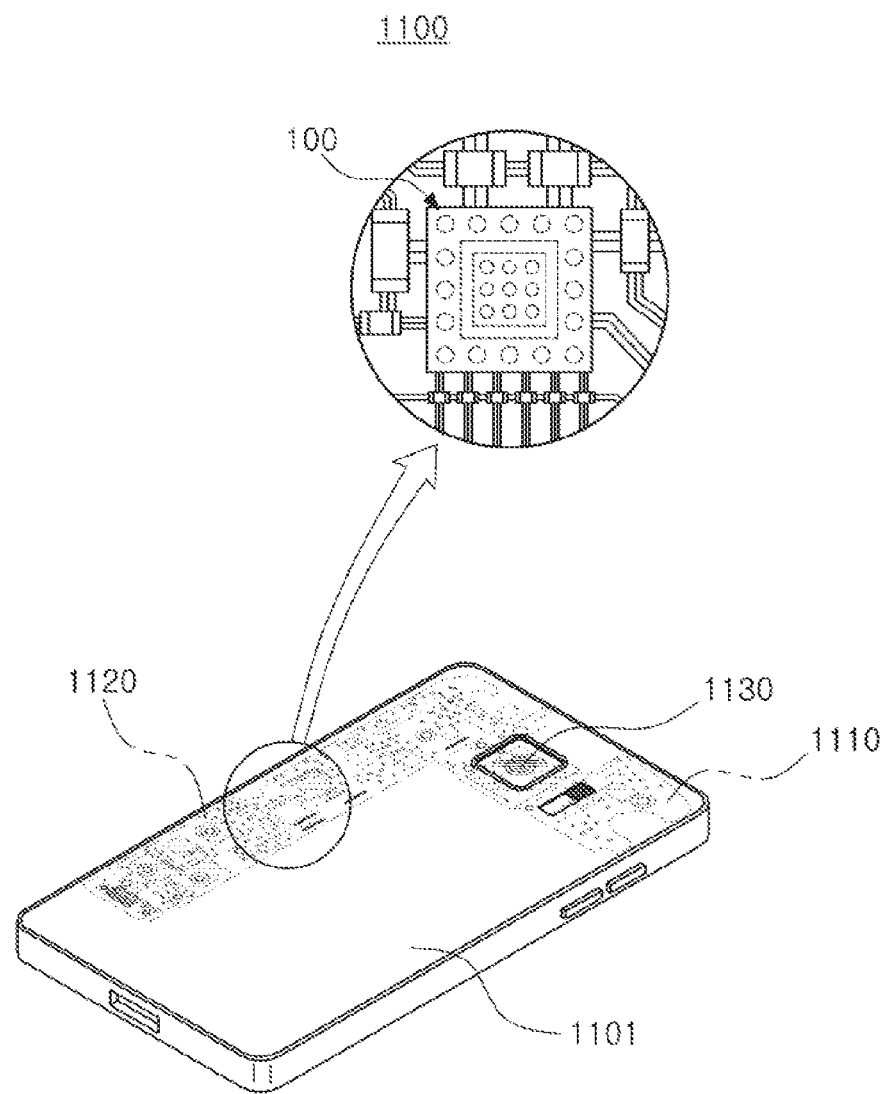
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
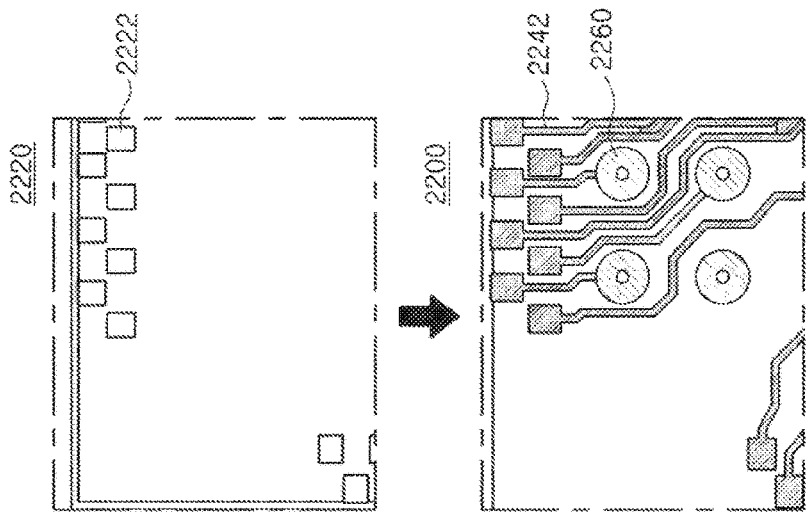
FIGS. 3A and 3B are schematic cross-sectional views illustrating states of a fan-in semiconductor package before and after being packaged.
Figure 3A:
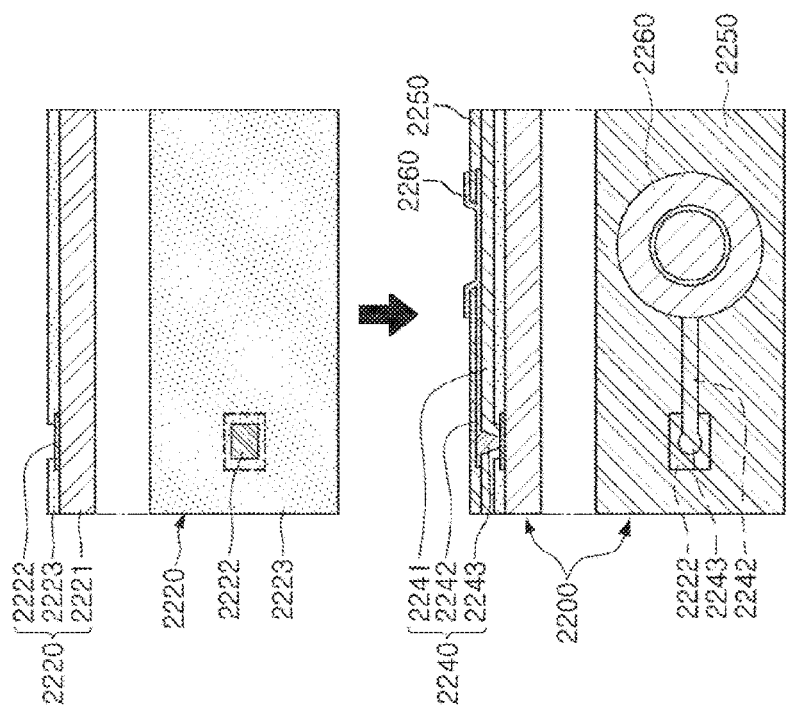

FIGS. 3A and 3B are schematic cross-sectional views illustrating states of a fan-in semiconductor package before and after being packaged.

Figure 4:
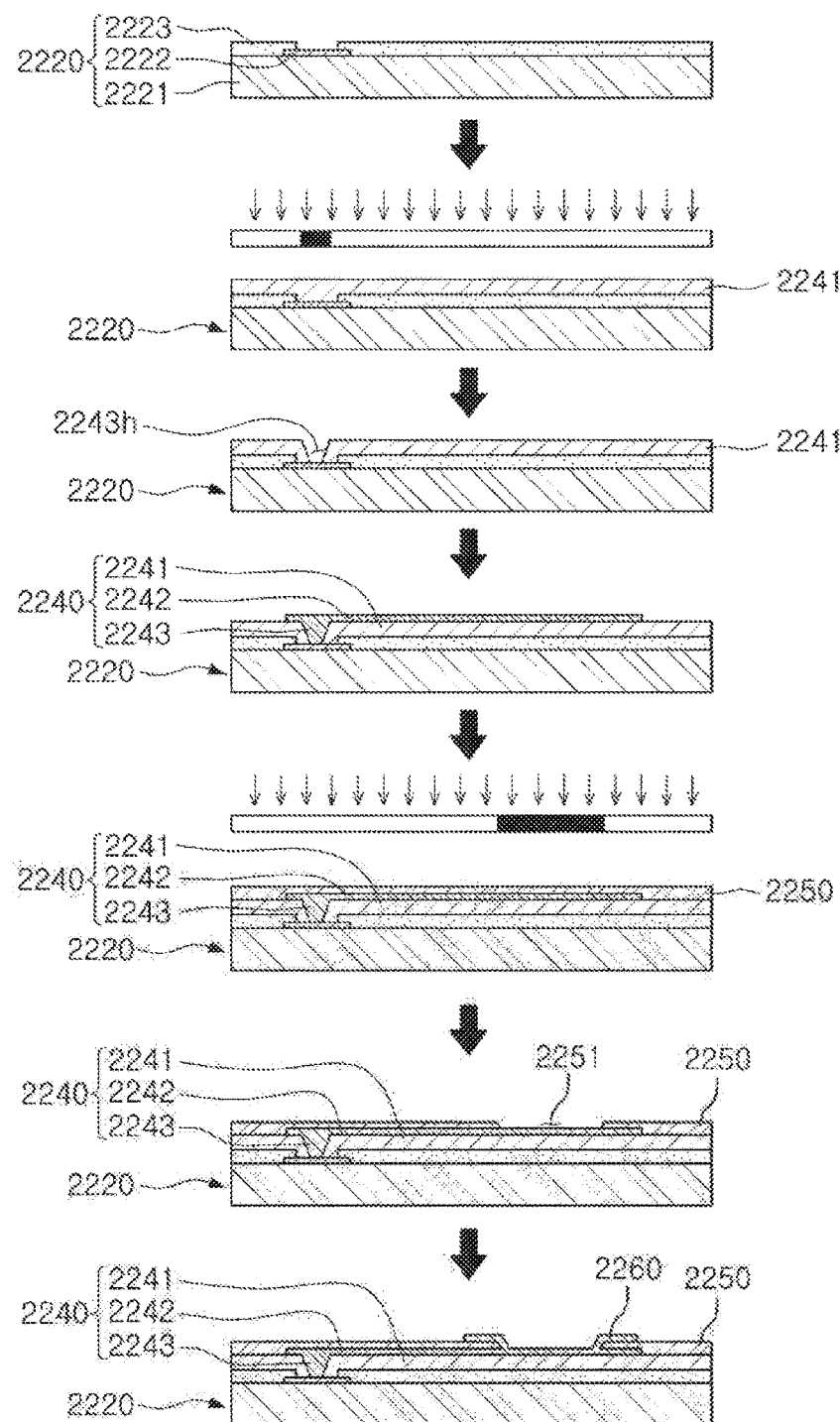
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
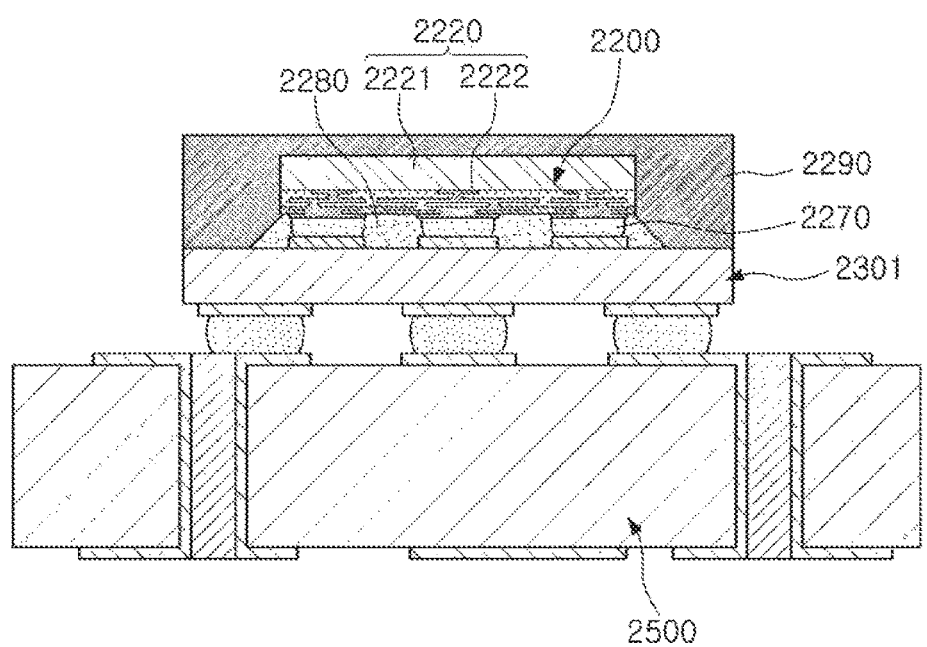
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
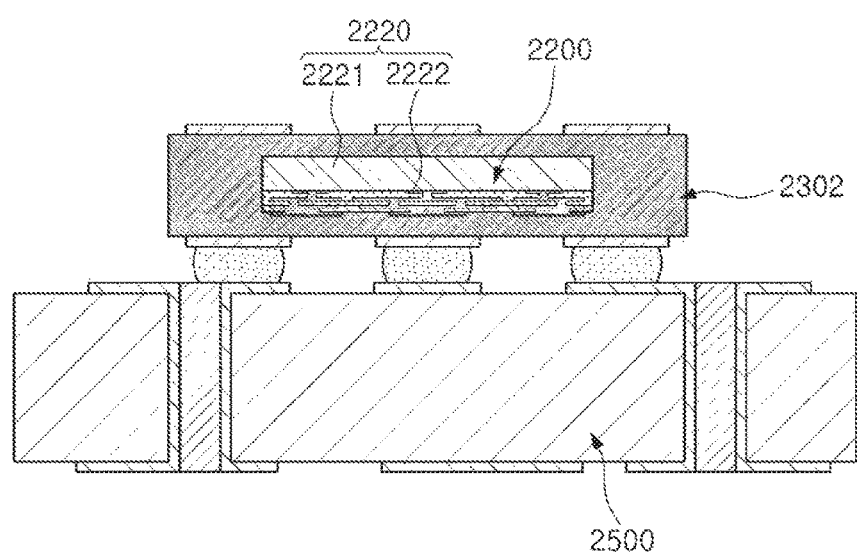
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
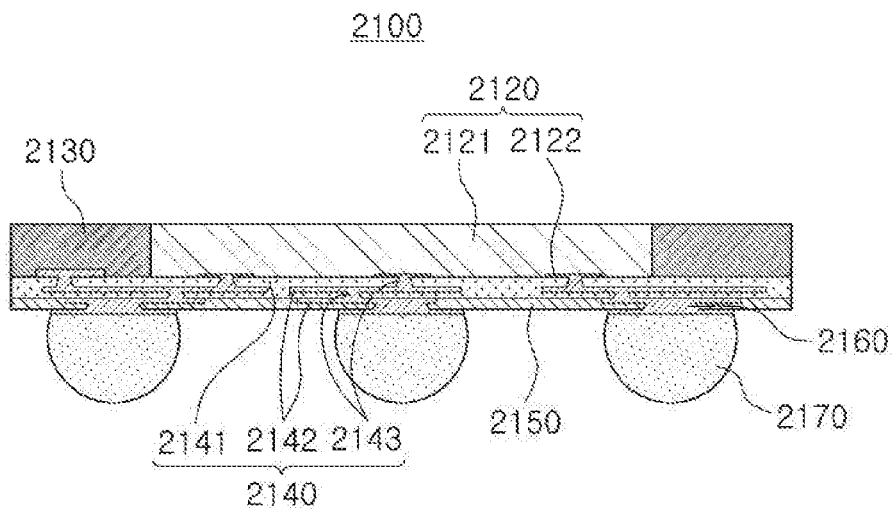
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced; a standardized ball layout may be used in the fan-out semiconductor package as is, such that the fan-out semiconductor package may be mounted on the main board of the electronic device without using a separate interposer substrate, as described below.

Figure 8:
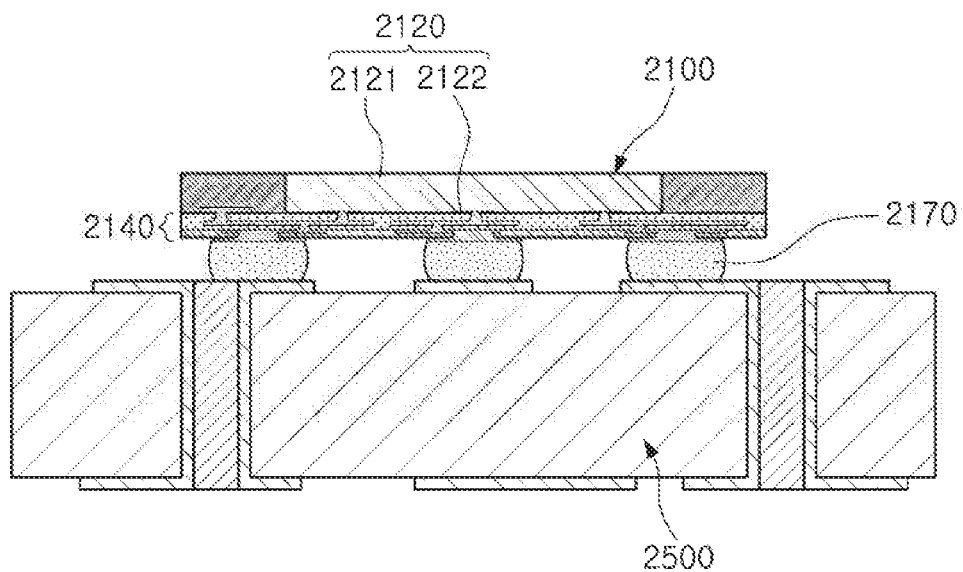
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of simultaneously performing various functions, being thinned, and having excellent mounting reliability will hereinafter be described with reference to the drawings.

Figure 9:
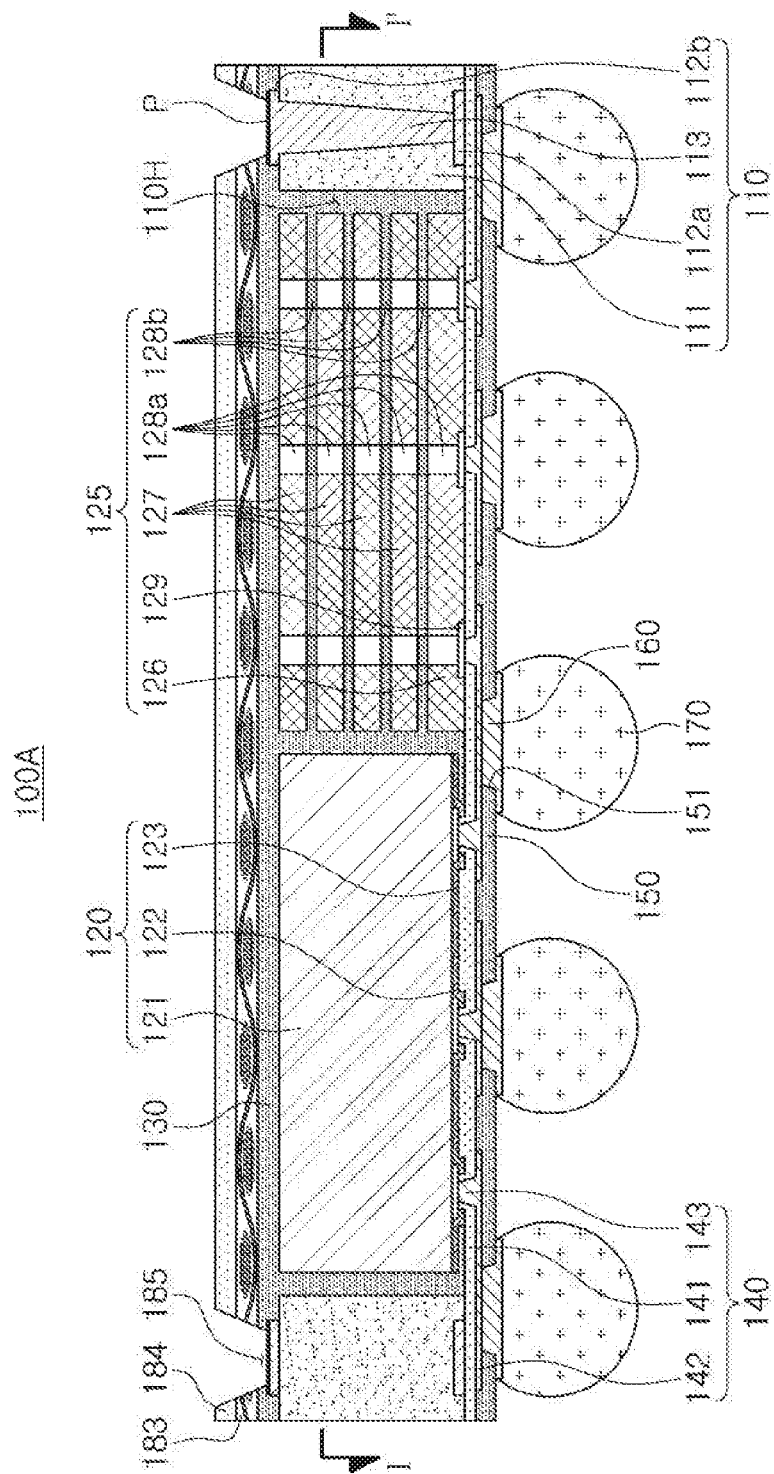
FIG. 9 is a schematic cross-sectional view illustrating an example of a fan-out semiconductor package.

FIG. 9 is a schematic cross-sectional view illustrating an example of a fan-out semiconductor package.

Figure 10:
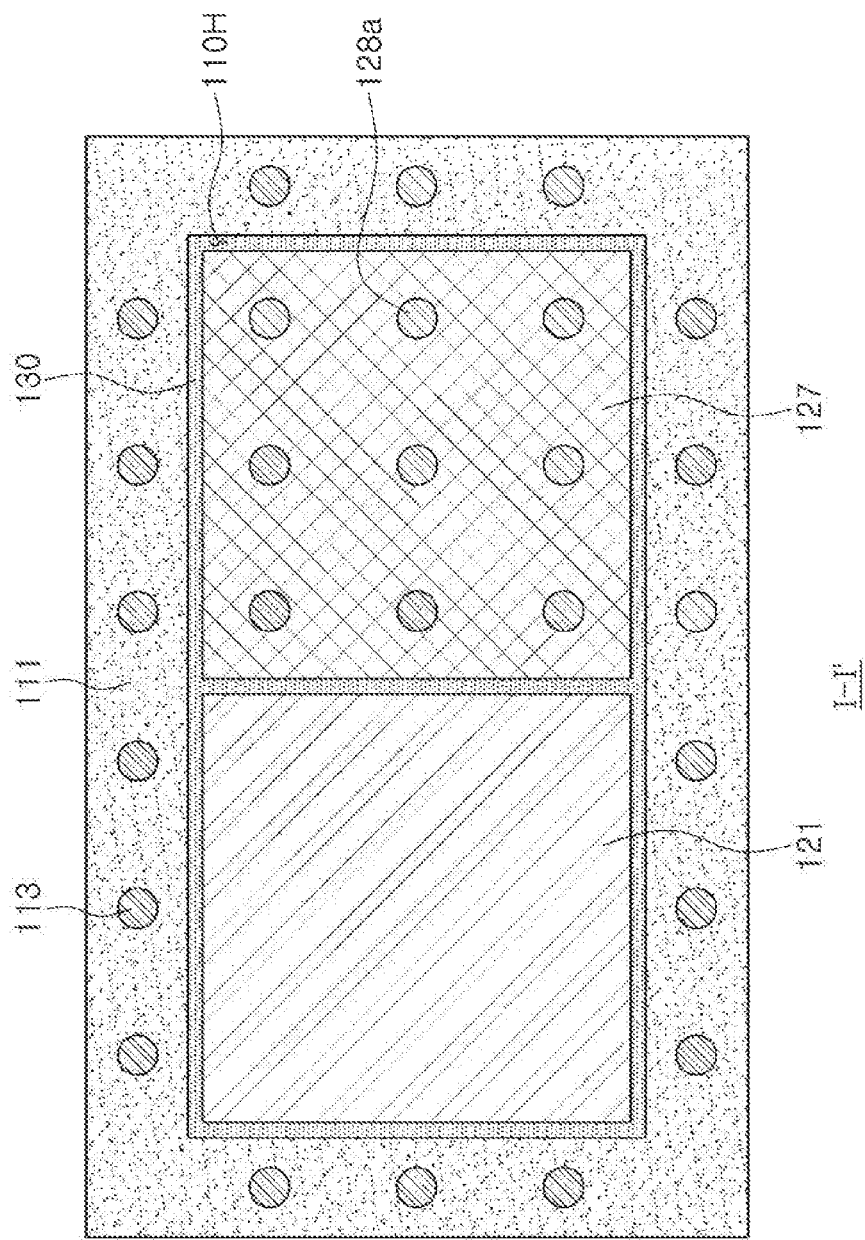
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a processor chip 120 disposed in the through-hole 110H of the first interconnection member 110 and having an active surface having connection pads 122 disposed thereon and an inactive surface opposing the active surface, a memory chip 125 disposed in the through-hole 110H of the first interconnection member 110, having an active surface having connection pads 129 disposed thereon, and having a form in which a plurality of dies 126 and 127 are stacked, an encapsulant 130 encapsulating at least portions of the first interconnection member 110, the memory chip 125, and the processor chip 120, a second interconnection member 140 disposed on the first interconnection member 110 and the active surfaces of the memory chip 125 and the processor chip 120, a passivation layer 150 disposed on the second interconnection member 140, an under-bump metal layer 160 formed in openings 151 of the passivation layer 150, connection terminals 170 formed on the under-bump metal layer 160, a reinforcing layer 183 disposed on the encapsulant 130, a resin layer 184 disposed on the reinforcing layer 183, openings 185 penetrating through the resin layer 184, the reinforcing layer 183, and the encapsulant 130 and exposing at least portions of a redistribution layer 112b of the first interconnection member 110, and a surface mounted technology (SMT) component surface-mounted on the passivation layer 150. The first interconnection member 110 and the second interconnection member 140 may respectively include redistribution layers 112a and 112b, and 142 electrically connected to the connection pads 122 of the processor chip 120 and the connection pads 129 of the memory chip 125. The connection pads 122 of the processor chip 120 and the connection pads 129 of the memory chip 125 may be electrically connected to each other by the redistribution layer 142 of the second interconnection member 140.

In general, a high performance server and a graphic card have a form in which a processor chip and a memory chip are connected to each other using a silicon-based interposer substrate. However, the silicon-based interposer substrate requires a large size, and is difficult technology due to problems of an assembling yield and reliability caused by a die shift and warpage at the time of connecting the memory chip to fine bumps. In order to solve this problem, it may be considered to package the processor chip in a form of a wafer level package and stack an interposer in which the memory chip is mounted on the wafer level package to implement a package-on-package (POP) form. However, in the wafer level package, the processor chip is simply molded with a molding material, such that there is still a problem of reliability such as warpage, or the like, and the package-on-package form is not appropriate for a recent situation in which thinness is necessarily required.

On the other hand, in the fan-out semiconductor package 100A according to the exemplary embodiment, the processor chip 120 and the memory chip 125 may be disposed substantially on the same level in the through-hole 110H of the first interconnection member 110, and be then electrically connected to each other by the second redistribution layer 142 of the second interconnection member 140, such that the connection pads of the processor chip 120 and the memory chip 125 may be redistributed. Therefore, the fan-out semiconductor package 100A may have tolerance more robust to mechanical and thermal stress through the first interconnection member 110, or the like, such that reliability of the fan-out semiconductor package 100A may be improved. In addition, the processor chip 120 and the memory chip 125 are not disposed on different levels, but may be disposed substantially on the same level, such that thinness of the fan-out semiconductor package 100A is possible. In addition, the respective inputs/outputs (I/O) having fine pitches may be redistributed up to a fan-out region through the second interconnection member 140, such that mounting reliability of the fan-out semiconductor package 100A may be improved.

Meanwhile, the processor chip 120 may have a thickness relatively greater than that of a die generally having a memory function. Therefore, the memory chip 125 having the form in which the plurality of dies 126 and 127 are stacked may be used as long as it does not have influence on a thickness of the fan-out semiconductor package 100A. Resultantly, efficiency of a memory function may be more excellent. In addition, the plurality of dies 126 and 127 may be electrically connected to each other by a plurality of through-electrodes 128a each penetrating through the plurality of dies 126 and 127 and a plurality of bumps 128b connecting the plurality of through-electrodes 128a to each other. In this connection form, a signal transfer path may be significantly reduced, and the encapsulant 130 may fill spaces between the plurality of dies 126 and 127 to sufficiently fix the memory chip 125, such that the reliability of the fan-out semiconductor package 100A may be further improved.

Meanwhile, the processor chip 120 may include an application processor (AP), and the memory chip 125 may include a high bandwidth memory (HBM) and/or a wide I/O (WIO). As described above, the AP and the HBM or the WIO that need to communicate with each other are mounted and are electrically connected to each other in one fan-out semiconductor package 100A, such that thinness of fan-out semiconductor package 100A may be promoted and a signal distance between the AP and the HBM or the WIO may be significantly reduced. In addition, the AP and the HBM or the WIO are disposed in the same through-hole 110H as small as possible, such that a process cost of the fan-out semiconductor package 100A may be reduced.

The respective components included in the fan-out semiconductor package 100A according to the exemplary embodiment will hereinafter be described in more detail.

The first interconnection member 110 may include the redistribution layers 112a and 112b redistributing the connection pads 122 of the processor chip 120 and/or the connection pads 129 of the memory chip 125 to thus reduce the number of layers of the second interconnection member 140. If necessary, the first interconnection member 110 may maintain rigidity of the fan-out semiconductor package 100A depending on materials thereof, and serve to secure uniformity of a thickness of the encapsulant 130. In some cases, due to the first interconnection member 110, the fan-out semiconductor package 100A according to the exemplary embodiment may be used as a portion of a package-on-package having another form. The first interconnection member 110 may have the through-hole 110H.

The through-hole 110H may have the processor chip 120 and the memory chip 125 disposed therein to be spaced apart from the first interconnection member 110 by a predetermined distance. Side surfaces of the processor chip 120 and the memory chip 125 may be surrounded by the first interconnection member 110. However, such a form is only an example and may be variously modified to have other forms, and the fan-out semiconductor package 100A may perform another function depending on such a form.

The first interconnection member 110 may include an insulating layer 111 in contact with the second interconnection member 140, a first redistribution layer 112a in contact with the second interconnection member 140 and embedded in the insulating layer 111, and a second redistribution layer 112b disposed on the other surface of the insulating layer 111 opposing one surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122 of the processor chip 120 and the connection pads 129 of the memory chip 125. When the first redistribution layer 112a is embedded in the insulating layer 111, a step generated due to a thickness of the first redistribution layer 112a may be significantly reduced, and an insulating distance of the second interconnection member 140 may thus become constant. That is, a difference between a distance from the redistribution layer 142 of the second interconnection member 140 to a lower surface of the insulating layer 111 and a distance from the redistribution layer 142 of the second interconnection member 140 to the connection pad 122 of the processor chip 120 may be smaller than a thickness of the first redistribution layer 112a. Therefore, a high density wiring design of the second interconnection member 140 may be easy.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122 of the processor chip 120 and/or the connection pads 129 of the memory chip 125, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions, depending on designs of layers corresponding thereto. For example, the redistribution layers 112a and 112b may include ground (GND) patterns, power (PWR) patterns, signal (S) patterns, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like. As a non-restrictive example, both of the redistribution layers 112a and 112b may include a ground pattern. In this case, the number of ground patterns formed on the redistribution layers 142 of the second interconnection member 140 may be significantly reduced, such that a degree of wiring design freedom may be improved.

A surface treatment layer P may further be formed on portions of a surface of the redistribution layer 112b exposed from the redistribution layers 112a and 112b through openings 131 formed in the encapsulant 130, if necessary. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like.

The vias 113 may electrically connect the redistribution layers 112a and 112b formed on different layers to each other, resulting in an electrical path in the first interconnection member 110. A material of each of the vias 113 may be a conductive material. Each of the vias 113 may be entirely filled with the conductive material, or the conductive material may be formed along a wall of respective via holes. In addition, each of the vias 113 may have all shapes known in the related art, such as a tapered shape, a cylindrical shape, and the like. Meanwhile, when holes for the vias 113 are formed, some of the pads of the first redistribution layer 112a may serve as a stopper, and it may thus be advantageous in a process that each of the vias 113 has the tapered shape of which a width of an upper surface is greater than that of a lower surface. In this case, the vias 113 may be integrated with the pad patterns of the second redistribution layer 112b.

The processor chip 120 may be an application specific integrated circuit (ASIC) provided in an amount of several hundreds to several millions of elements or more integrated in a single chip. In this case, the ASIC may be, for example, an application processor (AP) such as a central processor (for example, a CPU), a graphic processor (for example, a GPU), a field programmable gate array (FPGA), a digital signal processor, a cryptographic processor, a micro processor, a micro controller, or the like, but is not limited thereto. The processor chip 120 may be formed on the basis of an active wafer. In this case, a base material of a body 121 may be silicon (Si), germanium (Ge), gallium, arsenide (GaAs), or the like. Various circuits may be formed on the body 121. The connection pads 122 may electrically connect the processor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The inactive surface of the processor chip 120 may be disposed on a level below an upper surface of the second redistribution layer 112b of the first interconnection member 110. For example, the inactive surface of the processor chip 120 may be disposed on a level below an upper surface of the insulating layer 111 of the first interconnection member 110. A height difference between the inactive surface of the processor chip 120 and the upper surface of the second redistribution layer 112b of the first interconnection member 110 may be 2 μm or more, for example, 5 μm or more. In this case, generation of cracks in corners of the inactive surface of the processor chip 120 may be effectively prevented. In addition, a deviation of an insulating distance on the inactive surface of the processor chip 120 in a case in which the encapsulant 130 is used may be significantly reduced.

The memory chip 125 may be a high bandwidth memory (HBM), a wide I/O (WIO), or the like, in which a plurality of dynamic random access memories (DRAMs) 127 are stacked on a base die 126, but is not limited thereto. The base die 126 and the plurality of DRAMs 127 may be electrically connected to each other by the plurality of through-electrodes 128a each penetrating through the base die 126 and the plurality of DRAMs 127 and the plurality of bumps 128b connecting the plurality of through-electrodes 128a to each other. The through-electrode 128a may be a through-silicon via (TSV). The bump 128b may include a known conductive material. The base die 126 may have the connection pads 129 for being connected to the second interconnection member 140. Meanwhile, in some cases, the base die 126 may be omitted, and the memory chip 125 may include the plurality of DRAMs 127. In this case, a lowest DRAM may have the connection pads, but is not limited thereto.

The encapsulant 130 may protect the first interconnection member 110, the processor chip 120, the memory chip 125, and the like. An encapsulation form of the encapsulant 130 is not particularly limited, but may be a form in which the encapsulant 130 surrounds at least portions of the first interconnection member 110, the processor chip 120, the memory chip 125, and the like. For example, the encapsulant 130 may cover the first interconnection member 110 and the inactive surfaces of the memory chip 125 and the processor chip 120, and fill spaces between walls of the through-hole 110H, the side surfaces of the processor chip 120, and the side surfaces of the memory chip 125. In addition, the encapsulant 130 may also fill at least a portion of a space between the passivation layer 123 of the processor chip 120 and the second interconnection member 140. In addition, the encapsulant 130 may fill at least portions of spaces between the plurality of dies 126 and 127 of the memory chip 125. Meanwhile, the encapsulant 130 may fill the through-hole 110H to thus serve as an adhesive and reduce buckling of the semiconductor chip 120 depending on materials thereof.

The materials of the encapsulant 130 are not particularly limited. For example, an insulating material may be used as the materials of the encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. Alternatively, epoxy molding compound (EMC), PID, or the like, may be used as the insulating material. Alternatively, a material in which a thermosetting resin or a thermoplastic resin is impregnated together with an inorganic filler in a core material such as a glass cloth (or a glass fabric) may also be used as the insulating material.

The second interconnection member 140 may redistribute the connection pads 122 of the processor chip 120 and the connection pads 129 of the memory chip 125, and electrically connect the connection pads 122 of the processor chip 120 and the connection pads 129 of the memory chip 125 to each other. Several ten to several hundred connection pads 122 and 129 having various functions may be redistributed by the second interconnection member 140, and may be physically or electrically connected to an external source through the connection terminals 170 depending on the functions. The second interconnection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, and may also include a plurality of layers.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other or may be different from each other, as necessary. When the insulating layers 141 are the multiple layers, the insulating layers 141 may be integrated with each other depending on a process, such that a boundary therebetween may not be readily apparent.

The redistribution layers 142 may substantially serve to redistribute the connection pads 122 and/or the connection pads 129 of the memory chip 125. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions, depending on designs of layers corresponding thereto. For example, the redistribution layers 142 may include ground (GND) patterns, power (PWR) patterns, signal (S) patterns, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

A surface treatment layer (not illustrated) may be formed on a surface of the exposed redistribution layer 142, if necessary. The surface treatment layer may be formed by, for example, electrolytic gold plating, electroless gold plating, OSP or electroless tin plating, electroless silver plating, electroless nickel plating/substituted gold plating, DIG plating, HASL, or the like, but is not limited thereto.

The vias 143 may electrically connect the redistribution layers 142, the connection pads 122 and/or the connection pads 129, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be entirely filled with the conductive material, or the conductive material may also be formed along a wall of each of the vias. In addition, each of the vias 143 may have all shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the processor chip 120, the redistribution layers 112a and 112b formed in the first interconnection member 110 may be formed to be large depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be additionally configured to protect the second interconnection member 140 from external physical or chemical damage. The passivation layer 150 may have the openings 151 exposing at least portions of the redistribution layer 142 of the second interconnection member 140. The number of openings 151 formed in the passivation layer 150 may be several tens to several thousands.

A material having an elastic modulus greater than that of the insulating layer 141 of the second interconnection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the second interconnection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

The under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second interconnection member 140 exposed through the openings 151 of the passivation layer 150. The under-bump metal layer 160 may be formed in the openings 151 of the passivation layer 150 by a known metallization method using a known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the numbers of connection pads 122 and 129, or may be provided in an amount of several tens to several thousands or more or several tens to several thousands or less. When the connection terminals 170 are solder balls, the connection terminals 170 may cover side surfaces of the under-bump metal layer 160 extending onto one surface of the passivation layer 150, and connection reliability may be more excellent.

At least one of the connection terminals 170 may be disposed in a fan-out region. The fan-out region is a region except for the region in which the processor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

The reinforcing layer 183 may be additionally configured to suppress warpage generated in the fan-out semiconductor package 100A. For example, the reinforcing layer 183 may suppress hardening contraction of the material of the encapsulant 130, such as the thermosetting resin film to suppress warpage of the fan-out semiconductor package 100A. The reinforcing layer 183 may have an elastic modulus relatively greater than that of the encapsulant 130, and may have a coefficient of thermal expansion (CTE) smaller than that of the encapsulant 130. In this case, a warpage suppression effect may be particularly excellent.

The reinforcing layer 183 may include a core material, an inorganic filler, and an insulating resin. For example, the reinforcing layer 183 may be formed of an unclad copper clad laminate (CCL), prepreg, or the like. In a case in which the reinforcing layer 183 includes the core material such as a glass cloth (or a glass fabric), the reinforce layer 183 may be implemented to have a relatively large elastic modulus, and in case in which the reinforcing layer 183 includes the inorganic filler, the reinforce layer 183 may be implemented to have a relatively small CTE by adjusting a content of the inorganic filler. The reinforcing layer 183 may be attached in a hardened state (a c-stage) to the encapsulant 130. In this case, a boundary surface between the encapsulant 130 and the reinforcing layer 183 may have an approximately linear shape. Meanwhile, the inorganic filler may be silica, alumina, or the like, and the resin may be an epoxy resin, or the like. However, the inorganic filler and the resin are not limited thereto.

The resin layer 184 may be additionally configured to be disposed on the reinforcing layer 183. The resin layer 184 may be formed of a material that is the same as or similar to that of the encapsulant 130, for example, an insulating material that includes an inorganic filler and an insulating resin, but does not include a core material, that is, ABF, or the like. In a case in which the reinforcing layer 183 includes the core material, or the like, it may be difficult to form the openings 185 in the reinforcing layer 183, but in a case in which the resin layer 184 is added, the openings 185 may be easily formed. The openings 185 may penetrate through the encapsulant 130, the reinforcing layer 183, and the resin layer 184, and may expose at least portions of the redistribution layer 112b of the first interconnection member 110. The openings 185 may be utilized as openings for marking. Alternatively, the openings 185 may be utilized as openings for exposing pads in a package-on-package structure. Alternatively, the openings 185 may be utilized as openings for mounting a surface mounted technology (SMT) component. In a case in which the resin layer 184 is disposed, the warpage may be more easily suppressed.

In a case in which the insulating material that includes the inorganic filler and the insulating resin, but does not include the core material, for example, the ABF, or the like, is used as materials of both of the passivation layer 150 and the resin layer 184, that is, in a case in which a material having the same composition is used as materials of both of the passivation layer 150 and the resin layer 184, the fan-out semiconductor package 100A may have a symmetry effect by the passivation layer 150 and the resin layer 184, and the warpage of the fan-out semiconductor package 100A may be more effectively reduced by the symmetry effect.

The surface mounted technology (SMT) component may be additionally configured to be disposed substantially on the same level as that of the connection terminal 170 on the passivation layer 150. The SMT component may be a passive component such as a land side capacitor (LSC), or the like, but is not limited thereto. The SMT component may be electrically connected to the processor chip 120 and/or the memory chip 125 through the redistribution layer 142 of the second interconnection member 140.

Although not illustrated in the drawings, a metal layer may be further disposed on an inner wall of the through-hole 110H of the first interconnection member 110, if necessary. That is, the side surfaces of the processor chip 120 and/or the memory chip 125 may also be surrounded by the metal layer. Heat generated from the processor chip 120 and/or the memory chip 125 may be effectively dissipated upwardly or downwardly of the fan-out semiconductor package 100A through the metal layer, and electromagnetic waves may be effectively blocked by the metal layer. In addition, separate passive components such as a condenser, an inductor, and the like, may be encapsulated together with the processor chip and the memory chip in the through-hole 110H.

Figure 11:
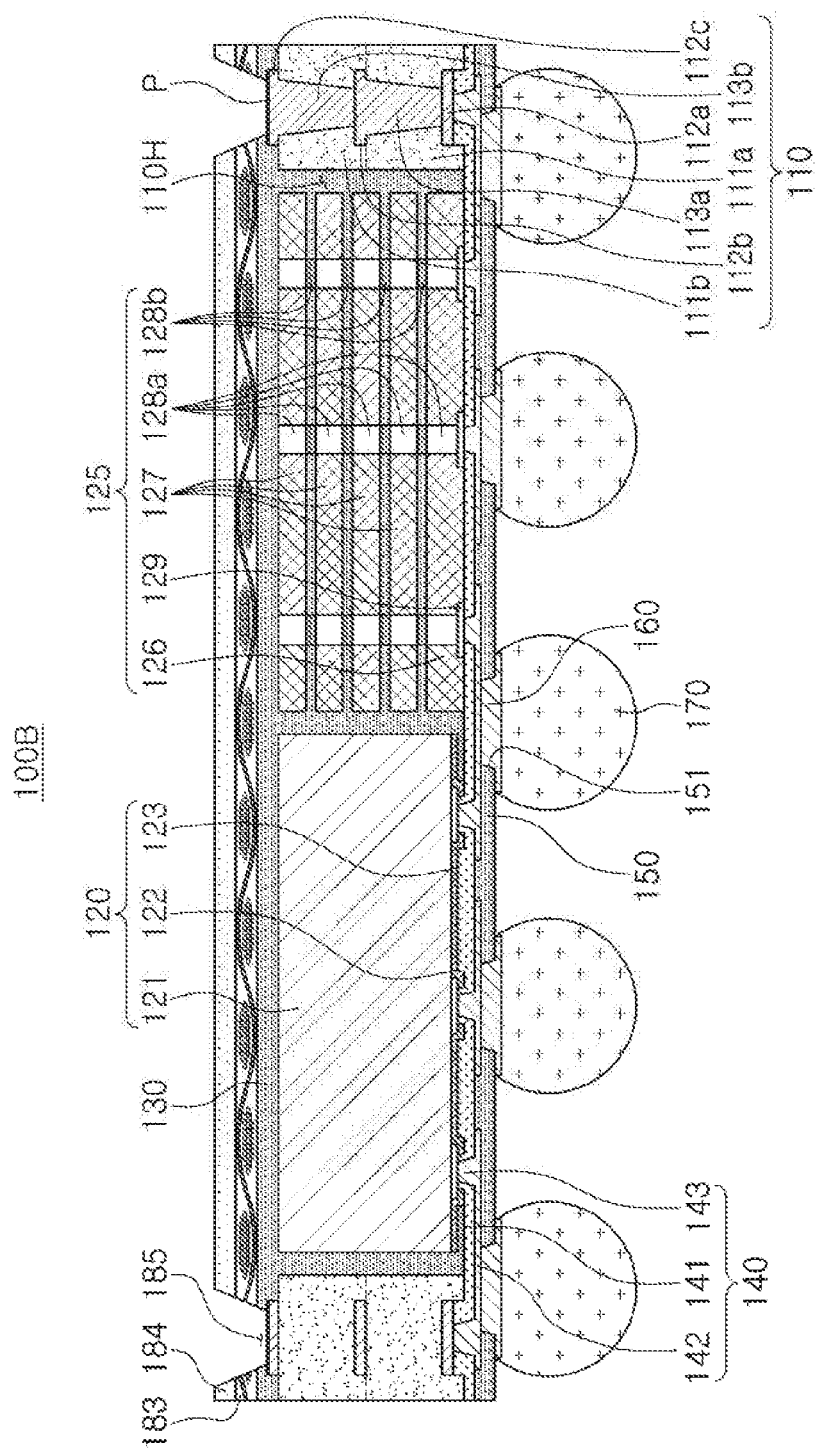
FIG. 11 is a schematic view illustrating a modified example of the fan-out semiconductor package of FIG. 9.

FIG. 11 is a schematic view illustrating a modified example of the fan-out semiconductor package of FIG. 9.

Referring to the drawing, in a fan-out semiconductor package 100B according to the modified example, a first interconnection member 110 may include a first insulating layer 111a in contact with a second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122 and 129. Meanwhile, the first and second redistribution layers 112a and 112b and the second and third redistribution layers 112b and 112c may be electrically connected to each other by first and second vias 113a and 113b penetrating through the first and second insulating layers 111a and 111b, respectively.

Since the first redistribution layer 112a is embedded in the first insulating layer 111a, an insulating distance of an insulating layer 141 of the second interconnection member 140 may be substantially constant, as described above. Since the first interconnection member 110 may include a large number of redistribution layers 112a, 112b, and 112c, the second interconnection member 140 may be simplified. Therefore, a decrease in a yield depending on a defect occurring in a process of forming the second interconnection member 140 may be improved. The first redistribution layer 112a may be recessed into the first insulating layer 111a, such that a lower surface of the first insulating layer 111a and a lower surface of the first redistribution layer 112a have a step therebetween. Resultantly, when an encapsulant 130 is formed, a phenomenon in which a material of the encapsulant 130 bleeds to pollute the first redistribution layer 112a may be prevented.

A lower surface of the first redistribution layer 112a of the first interconnection member 110 may be disposed on a level above a lower surface of the connection pad 122 of a processor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pad 122 of the processor chip 120. Here, the first redistribution layer 112a may be recessed into the first insulating layer 111a. The second redistribution layer 112b of the first interconnection member 110 may be disposed on a level between an active surface and an inactive surface of the processor chip 120. The first interconnection member 110 may be formed at have a thickness corresponding to that of the processor chip 120. Therefore, the second redistribution layer 112b formed in the first interconnection member 110 may be disposed on a level between the active surface and the inactive surface of the processor chip 120.

Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the processor chip 120, the redistribution layers 112a, 112b, and 112c may be formed to be large depending on a scale of the first interconnection member 110. On the other hand, the redistribution layer 142 of the second interconnection member 140 may be formed to be relatively small for thinness. Other contents overlap those described above, and a detailed description thereof is thus omitted.

Figure 12:
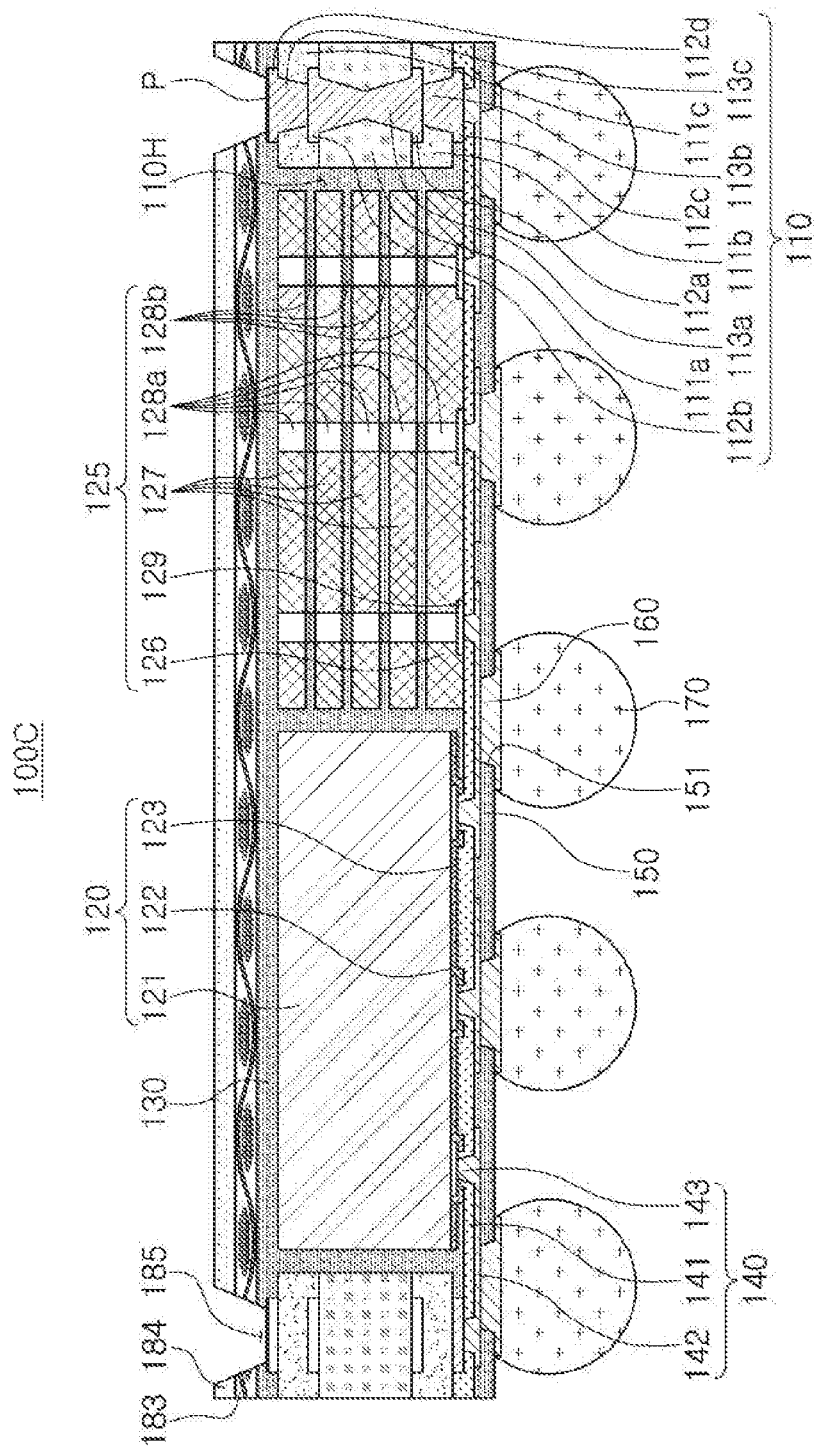
FIG. 12 is a schematic cross-sectional view illustrating another modified example of the fan-out semiconductor package of FIG. 9.

FIG. 12 is a schematic cross-sectional view illustrating another modified example of the fan-out semiconductor package of FIG. 9.

Referring to the drawing, in a fan-out semiconductor package 100C according to another modified example, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122 and 129. Since the first interconnection member 110 may include a larger number of redistribution layers 112a, 112b, 112c, and 112d, a second interconnection member 140 may be further simplified. Therefore, a decrease in a yield depending on a defect occurring in a process of forming the second interconnection member 140 may be improved. Meanwhile, the first to fourth redistribution layers 112a, 112b, 112c, and 112d may be electrically connected to each other by first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pad 122 of a processor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pads 122 of the processor chip 120. Here, the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the processor chip 120. The first interconnection member 110 may be formed at have a thickness corresponding to that of the processor chip 120. Therefore, the first redistribution layer 112a and the second redistribution layer 112b formed in the first interconnection member 110 may be disposed on a level between the active surface and the inactive surface of the processor chip 120.

Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the processor chip 120, the redistribution layers 112a, 112b, 112c, and 112d may also be formed to have large sizes. On the other hand, the redistribution layer 142 of the second interconnection member 140 may be formed to be relatively small for thinness. Other contents overlap those described above, and a detailed description thereof is thus omitted.

Figure 13:
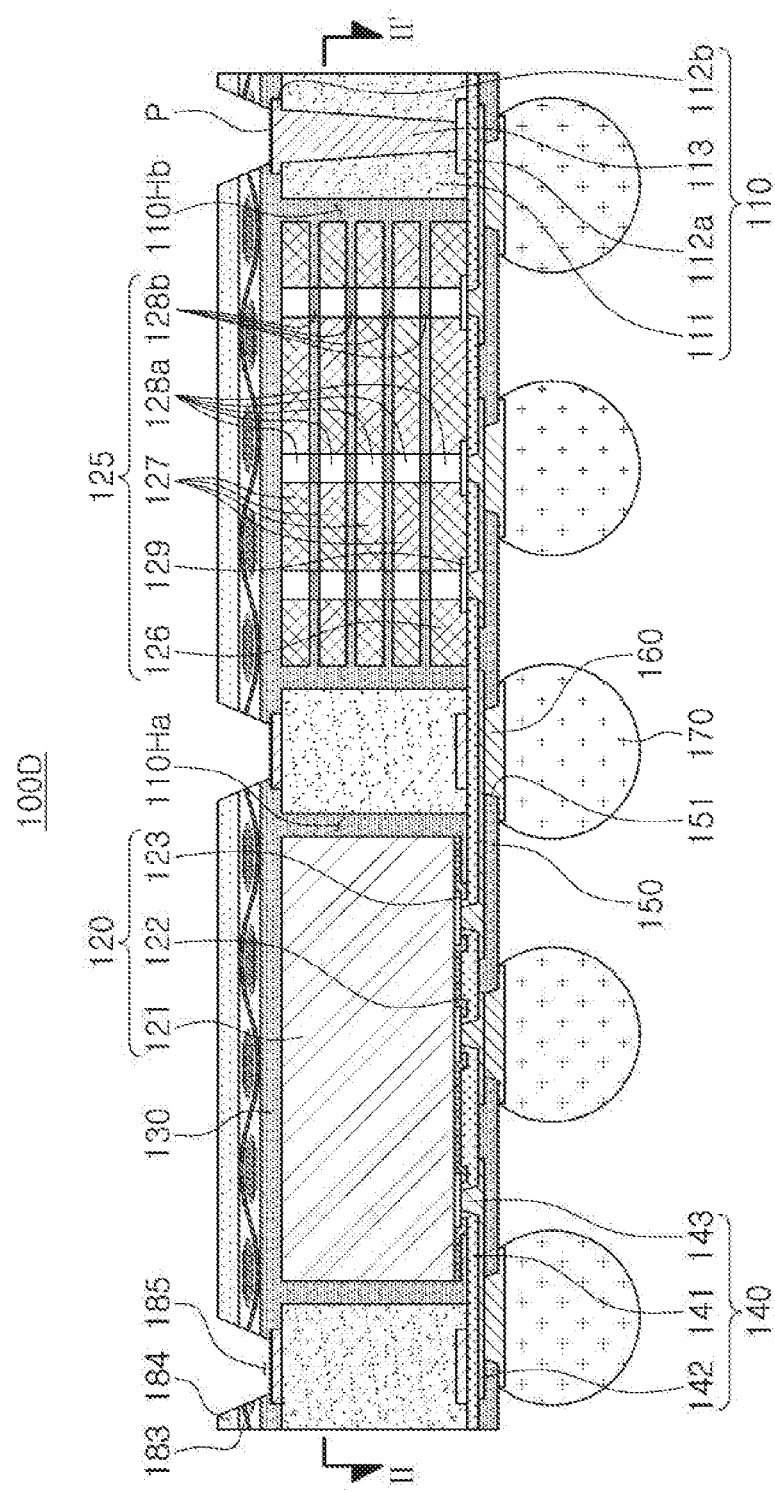
FIG. 13 is a schematic cross-sectional view illustrating another example of a fan-out semiconductor package.

FIG. 13 is a schematic cross-sectional view illustrating another example of a fan-out semiconductor package.

Figure 14:
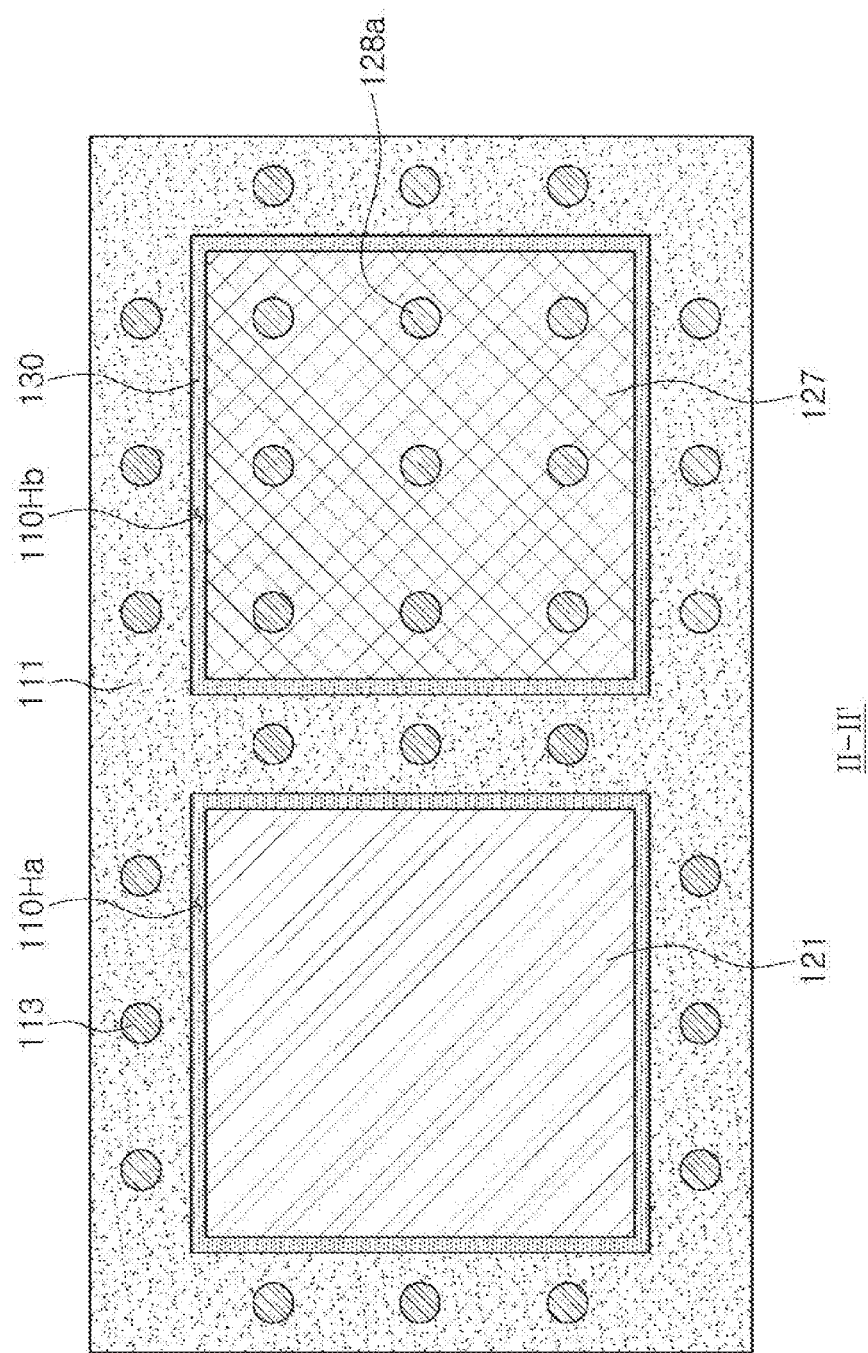
FIG. 14 is a schematic plan view taken along line II-II' of the fan-out semiconductor package of FIG. 13.

FIG. 14 is a schematic plan view taken along line II-II' of the fan-out semiconductor package of FIG. 13.

Referring to the drawings, a fan-out semiconductor package 100D according to another exemplary embodiment in the present disclosure may include a first interconnection member 110 having a plurality of through-holes 110Ha and 110Hb, a processor chip 120 disposed in a first through-hole 110Ha of the first interconnection member 110 and having an active surface having connection pads 122 disposed thereon and an inactive surface opposing the active surface, a memory chip 125 disposed in a second through-hole 110Hb of the first interconnection member 110, having an active surface having connection pads 129 disposed thereon, and having a form in which a plurality of dies 126 and 127 are stacked, an encapsulant 130 encapsulating at least portions of the first interconnection member 110, the memory chip 125, and the processor chip 120, a second interconnection member 140 disposed on the first interconnection member 110 and the active surfaces of the memory chip 125 and the processor chip 120, a passivation layer 150 disposed on the second interconnection member 140, an under-bump metal layer 160 formed in openings 151 of the passivation layer 150, connection terminals 170 formed on the under-bump metal layer 160, a reinforcing layer 183 disposed on the encapsulant 130, a resin layer 184 disposed on the reinforcing layer 183, openings 185 penetrating through the resin layer 184, the reinforcing layer 183, and the encapsulant 130 and exposing at least portions of a redistribution layer 112b of the first interconnection member 110, and a surface mounted technology (SMT) component surface-mounted on the passivation layer 150. The first interconnection member 110 and the second interconnection member 140 may respectively include redistribution layers 112a and 112b, and 142 electrically connected to the connection pads 122 of the processor chip 120 and the connection pads 129 of the memory chip 125, and the connection pads 122 of the processor chip 120 and the connection pads 129 of the memory chip 125 may be electrically connected to each other by the redistribution layer 142 of the second interconnection member 140. As described above, in the fan-out semiconductor package 100D according to another exemplary embodiment, the first interconnection member 110 may include the plurality of through-holes 110Ha and 110Hb, and the processor chip 120 and the memory chip 125 may be disposed in the through-holes 110Ha and 110Hb, respectively. In this case, mechanical and/or thermal stress of the fan-out semiconductor package 100D may be more efficiently controlled. Other contents overlap those described above, and a detailed description thereof is thus omitted.

Figure 15:
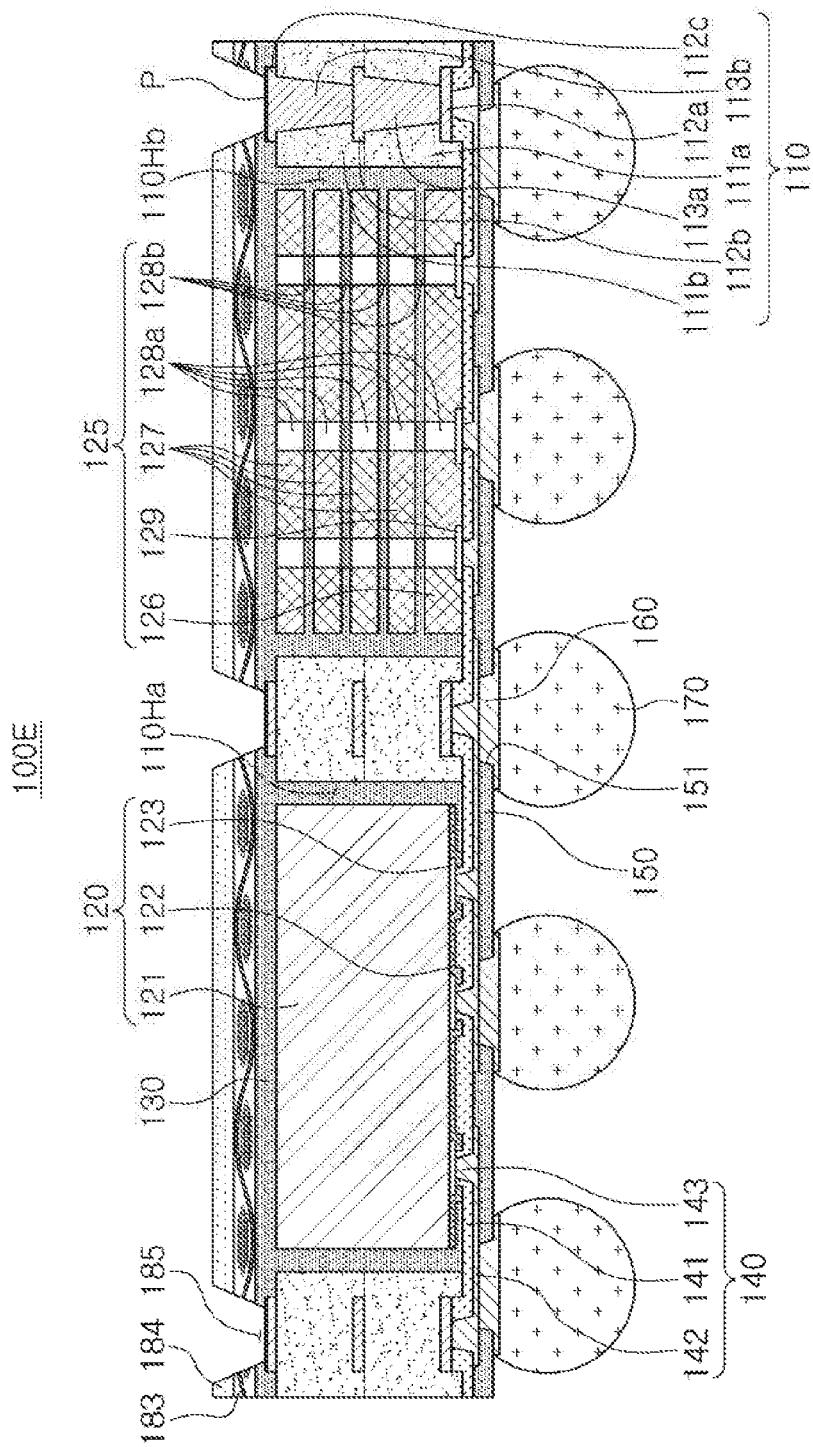
FIG. 15 is a schematic view illustrating a modified example of the fan-out semiconductor package of FIG. 13.

FIG. 15 is a schematic view illustrating a modified example of the fan-out semiconductor package of FIG. 13.

Referring to the drawing, also in a case in which a first interconnection member 110 includes a plurality of through-holes 110Ha and 110Hb and a processor chip 120 and a memory chip 125 are disposed in the through-holes 110Ha and 110Hb, respectively, as in a fan-out semiconductor package 100E according to the modified example, the first interconnection member 110 may include a first insulating layer 111a in contact with a second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first and second redistribution layers 112a and 112b and the second and third redistribution layers 112b and 112c may be electrically connected to each other by first and second vias 113a and 113b penetrating through the first and second insulating layers 111a and 111b, respectively. Other contents overlap those described above, and a detailed description thereof is thus omitted.

Figure 16:
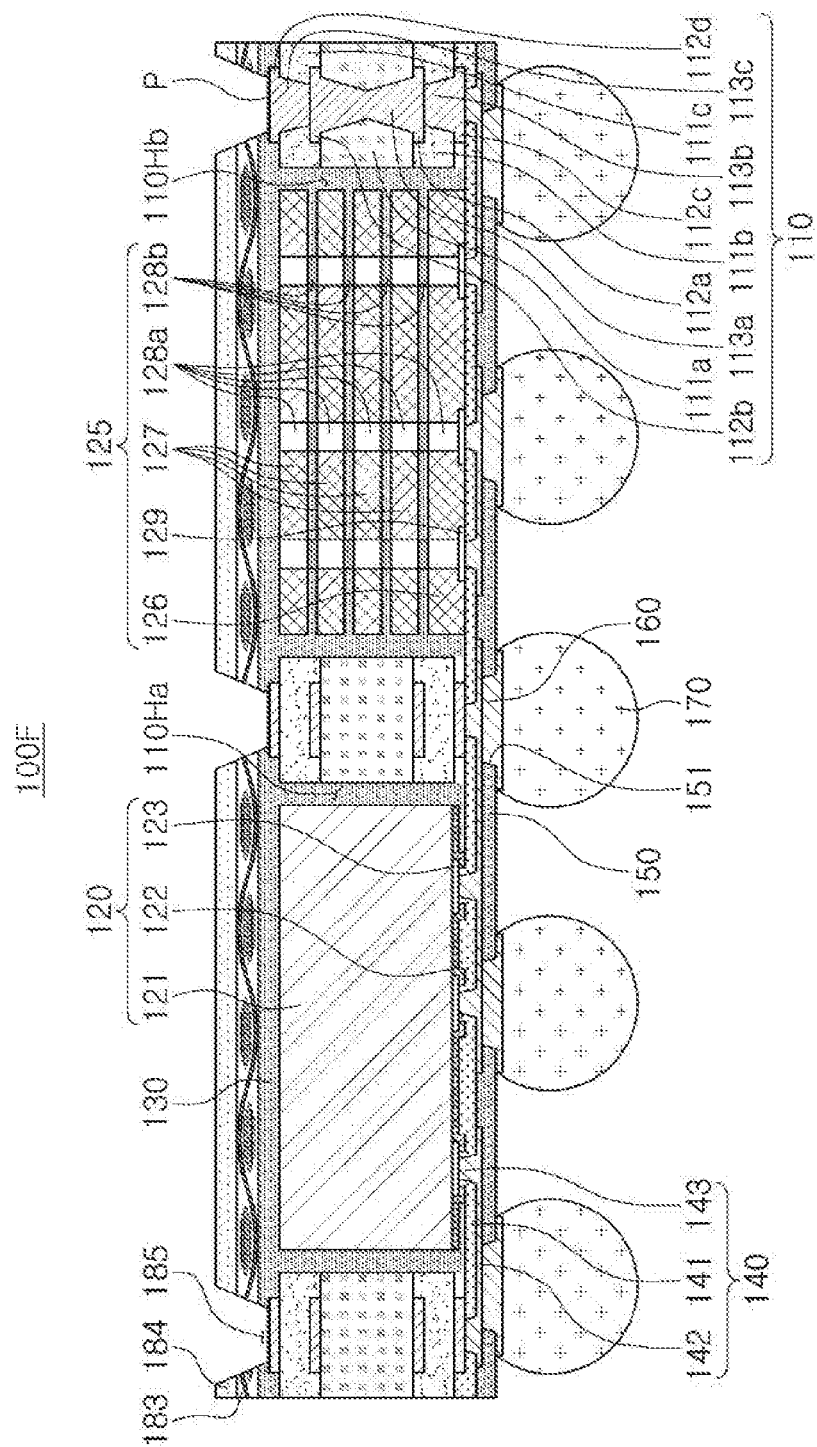
FIG. 16 is a schematic view illustrating another modified example of the fan-out semiconductor package of FIG. 13.

FIG. 16 is a schematic view illustrating another modified example of the fan-out semiconductor package of FIG. 13.

Referring to the drawing, also in a case in which a first interconnection member 110 includes a plurality of through-holes 110Ha and 110Hb and a processor chip 120 and a memory chip 125 are disposed in the through-holes 110Ha and 110Hb, respectively, as in a fan-out semiconductor package 100F according to another modified example, the first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other by first to third vias 113a, 113b, and 113c each penetrating through the first to third insulating layers 111a, 111b, and 111c. Other contents overlap those described above, and a detailed description thereof is thus omitted.

As set forth above, according to the exemplary embodiment in the present disclosure, a fan-out semiconductor package capable of performing various functions, being thinned, and having excellent mounting reliability may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a processor chip disposed in the through-hole of the first interconnection member and having an active surface having connection pads disposed thereon and an inactive surface opposing the active surface;
a memory chip disposed in the through-hole of the first interconnection member, having an active surface having connection pads disposed thereon, and including a plurality of dies stacked on each other;
an encapsulant encapsulating at least portions of the first interconnection member, the memory chip, and the processor chip; and
a second interconnection member disposed on the first interconnection member, the active surface of the memory chip, and the active surface of the processor chip,
wherein the first interconnection member and the second interconnection member respectively include redistribution layers electrically connected to the connection pads of the processor chip and the connection pads of the memory chip,
the connection pads of the processor chip and the connection pads of the memory chip are electrically connected to each other by the redistribution layer of the second interconnection member, and the connection pads of the processor chip are connected to the redistribution layer of the second interconnection member directly through first vias in the second interconnection member.

2. The fan-out semiconductor package of claim 1, wherein the connection pads of the memory chip are connected to the redistribution layer of the second interconnection member directly through second vias in the second interconnection member.

3. The fan-out semiconductor package of claim 1, wherein the processor chip includes an application processor (AP), and
the memory chip includes at least one of a high bandwidth memory (HBM) and a wide input/output (WIO).

4. The fan-out semiconductor package of claim 1, wherein the plurality of dies are electrically connected to each other by a plurality of through-electrodes each penetrating through the plurality of dies and a plurality of bumps connecting the plurality of through-electrodes to each other.

5. The fan-out semiconductor package of claim 4, wherein the encapsulant fills at least portions of spaces between the plurality of dies.

6. The fan-out semiconductor package of claim 1, wherein the first interconnection member includes a first insulating layer, a first redistribution layer in contact with the second interconnection member and embedded in the first insulating layer, and a second redistribution layer disposed on the other surface of the first insulating layer opposing one surface of the first insulating layer in which the first redistribution layer is embedded.

7. The fan-out semiconductor package of claim 6, wherein the first interconnection member further includes a second insulating layer disposed on the first insulating layer and covering the second redistribution layer and a third redistribution layer disposed on the second insulating layer.

8. The fan-out semiconductor package of claim 6, wherein the second redistribution layer is disposed on a level between the active surface and the inactive surface of the processor chip.

9. The fan-out semiconductor package of claim 6, wherein a distance between the redistribution layer of the second interconnection member and the first redistribution layer is greater than that between the redistribution layer of the second interconnection member and the connection pad of the processor chip.

10. The fan-out semiconductor package of claim 6, wherein the first redistribution layer has a thickness greater than that of the redistribution layer of the second interconnection member.

11. The fan-out semiconductor package of claim 1, wherein the first interconnection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

12. The fan-out semiconductor package of claim 11, wherein the first interconnection member further includes a third insulating layer disposed on the first insulating layer and covering the second redistribution layer and a fourth redistribution layer disposed on the third insulating layer.

13. The fan-out semiconductor package of claim 11, wherein the first insulating layer has a thickness greater than that of the second insulating layer.

14. The fan-out semiconductor package of claim 11, wherein the third redistribution layer has a thickness greater than that of the redistribution layer of the second interconnection member.

15. The fan-out semiconductor package of claim 11, wherein the first redistribution layer is disposed on a level between the active surface and the inactive surface of the processor chip.

16. The fan-out semiconductor package of claim 1, further comprising:
a reinforcing layer disposed on the encapsulant and including a core material, an inorganic filler, and an insulating resin;
a resin layer disposed on the reinforcing layer and including an inorganic filler and an insulating resin; and
openings penetrating through the resin layer, the reinforcing layer, and the encapsulant and exposing at least portions of the redistribution layer of the first interconnection member.

17. A fan-out semiconductor package comprising:
a first interconnection member having a through-hole;
a processor chip disposed in the through-hole of the first interconnection member and having an active surface having connection pads disposed thereon and an inactive surface opposing the active surface;
a memory chip disposed in the through-hole of the first interconnection member, having an active surface having connection pads disposed thereon, and including a plurality of dies stacked on each other;
an encapsulant encapsulating at least portions of the first interconnection member, the memory chip, and the processor chip; and
a second interconnection member disposed on the first interconnection member, the active surface of the memory chip, and the active surface of the processor chip,
wherein the first interconnection member and the second interconnection member respectively include redistribution layers electrically connected to the connection pads of the processor chip and the connection pads of the memory chip,
the connection pads of the processor chip and the connection pads of the memory chip are electrically connected to each other by the redistribution layer of the second interconnection member,
the connection pads of the processor chip are connected to the redistribution layer of the second interconnection member directly through first vias in the second interconnection member,
the second interconnection member includes an insulating layer made of a photosensitive insulating material,
the first and second vias of the second interconnection member embedded in the insulating layer of the second interconnection member, and
the redistribution layer of the second interconnection member is disposed on the insulating layer of the second interconnection member.

18. The fan-out semiconductor package of claim 17, further comprising:
a passivation layer disposed on the insulating layer of the second interconnection member and having openings opening portions of the redistribution layer of the second interconnection member, and
connection terminals filling the openings of the passivation layer and electrically connected to the redistribution layer of the second interconnection member.

19. A fan-out semiconductor package comprising:
a first interconnection member having first and second through-holes spaced-apart from each other;
a processor chip disposed in the first through-hole of the first interconnection member and having an active surface having connection pads disposed thereon and an inactive surface opposing the active surface;
a memory chip disposed in the second through-hole of the first interconnection member, having an active surface having connection pads disposed thereon, and including a plurality of dies stacked on each other;
an encapsulant encapsulating at least portions of the first interconnection member, the memory chip, and the processor chip; and
a second interconnection member disposed on the first interconnection member, the active surface of the memory chip, and the active surface of the processor chip,
wherein the first interconnection member and the second interconnection member respectively include redistribution layers electrically connected to the connection pads of the processor chip and the connection pads of the memory chip,
the connection pads of the processor chip and the connection pads of the memory chip are electrically connected to each other by the redistribution layer of the second interconnection member, and
the connection pads of the processor chip are connected to the redistribution layer of the second interconnection member directly through first vias in the second interconnection member.

20. The fan-out semiconductor package of claim 19, wherein the connection pads of the memory chip are connected to the redistribution layer of the second interconnection member directly through second vias in the second interconnection member.

* * * * *